United States Patent
Cheng (10) Patent No.: US 11,023,209 B2
(45) Date of Patent: Jun. 1, 2021

(54) ON-CHIP HARDWARE RANDOM NUMBER GENERATOR

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 16/257,106

(22) Filed: Jan. 25, 2019

(65) Prior Publication Data

US 2020/0241842 A1    Jul. 30, 2020

(51) Int. Cl.
*G06F 7/58*        (2006.01)
*G11C 11/16*       (2006.01)

(52) U.S. Cl.
CPC .............. *G06F 7/588* (2013.01); *G06F 7/582* (2013.01); *G11C 11/1659* (2013.01); *G11C 11/1673* (2013.01); *G11C 11/1675* (2013.01)

(58) Field of Classification Search
CPC .... G06F 7/588; G06F 7/58; G06F 7/582–586; G11C 11/1675; G11C 11/1659; G11C 11/1673; G11C 11/161
See application file for complete search history.

(56) References Cited

U.S. PATENT DOCUMENTS

| | | | |
|---|---|---|---|
| 7,007,050 B2 | 2/2006 | Saarinen | |
| 7,791,059 B2 | 9/2010 | Jedema | |
| 8,595,277 B2 | 11/2013 | Goettfert | |
| 9,110,746 B2 | 8/2015 | Zhu | |
| 9,436,436 B2 | 9/2016 | Humble | |
| 9,640,247 B2 * | 5/2017 | Chen | G11C 11/417 |
| 10,839,872 B2 * | 11/2020 | Hsu | G11C 7/14 |
| 10,860,292 B2 * | 12/2020 | Ielmini | G09C 1/00 |
| 2010/0146025 A1 | 6/2010 | Ergun | |
| 2017/0010864 A1 * | 1/2017 | Jacobson | G11C 11/1697 |
| 2017/0242660 A1 * | 8/2017 | Katoh | H04L 9/003 |
| 2017/0344343 A1 | 11/2017 | Best | |
| 2018/0129476 A1 | 5/2018 | Wesson | |
| 2018/0143806 A1 | 5/2018 | Park | |
| 2018/0234081 A1 | 8/2018 | Hung | |
| 2018/0239590 A1 | 8/2018 | Gupta | |
| 2018/0287793 A1 * | 10/2018 | Khatib Zadeh | G11C 13/0004 |

(Continued)

OTHER PUBLICATIONS

Ohsawa et al., on "A 1 Mb Nonvolatile Embedded Memory Using 4T2MTJ Cell With 32 b Fine-Grained Power Gating Scheme" in IEEE Hournal of Solid-State Circuits, vol. 48, No. 6. Retrieved on [May 21, 2020] Retrieved from the Internet <https://ieeexplore.ieee.org/stamp/stamp.jsp?tp=&arnumber=6495490> (Year: 2013).*

(Continued)

*Primary Examiner* — Andrew Caldwell
*Assistant Examiner* — Carlo Waje
(74) *Attorney, Agent, or Firm* — William E. Schiesser (57) ABSTRACT

An electric device for a hardware random number generator is provided. The hardware random number generator comprises: one or more bitcells which comprise a first pair of a first transistor and a first tunable resistor and a second pair of a second transistor and a second tunable resistor, with the first pair is cross-coupled with the second pair.

15 Claims, 4 Drawing Sheets

(56) References Cited

U.S. PATENT DOCUMENTS

2020/0013438 A1\* 1/2020 Hsu .................. G06F 7/588
2020/0097255 A1\* 3/2020 Chuang .............. G11C 11/1673

OTHER PUBLICATIONS

Yeh et al. on "Self-Convergent Trimming SRAM True Random Number Generation With In-Cell Storage" in IEEE Journal of Solid-State Circuits, vol. 54, No. 9, pp. 2614-2621. Retrieved on [May 20, 2020], Retrieved from the Internet <https://ieeexplore.ieee.org/abstract/document/8759954/references#references> (Year: 2019).\*

Clark et al. on "SRAM Circuits for True Random Number Generation Using Intrinsic Bit Instability" in IEEE Transactions on Very Large Scale Integration systems, vol. 26. Retrieved on [May 21, 2020], Retrieved from the Internet <https://ieeexplore.ieee.org/stamp/stamp.jsp?tp=&arnumber=8374983> (Year: 2018).\*

Tehrani et al. on "Progress and Outlook for MRAM Technology" in IEEE Transactions on Magnetics, vol. 35, No. 5, Sep. 1999. Retrieved on [May 22, 2020], Retrieved from the Internet <https://ieeexplore.ieee.org/stamp/stamp.jsp?tp=&arnumber=800991> (Year: 1999).\*

Natsui et al. on "Fabrication of a MTJ-Based Multilevel Resistor Towards Process-Variaton-Resilient Logic LSI" in 2012 IEEE 12th International New Circuits and Systems Conference, pp. 468-468. Retrieved on [May 22, 2020], Retrieved from the Internet <https://ieeexplore.ieee.org/document/6934084> (Year: 2012).\*

Cherkaoui et al., "A Self-Timed Ring Based True Random Number Generator", 19th IEEE International Symposium on Asynchronous Circuits and Systems, © 2013 IEEE, pp. 99-106.

Clima et al., "First-principles simulation of oxygen diffusion in HFOx: Role in the resistive switching mechanism", Applied Physics Letters 100, 133102 (2012), Published Online: Mar. 26, 2012, ©2012 American Institute of Physics, 5 pages.

Holleman et al., "A 3µW CMOS True Random Number Generator With Adaptive Floating-Gate Offset Cancellation", IEEE Journal of Solid-State Circuits, Vol. 43, No. 5, May 2008, pp. 1324-1336.

Ramanjaneyulu et al., "An Implementation of Tunable True Random Number Generator for XILINX FPGA", IJECEC, ISSN(Online):2533-8945, vol. 4 Issue 3, May 2018, 7 pages.

Sharma et al., "Magneto-Electric Magnetic Tunnel Junction as Process Adder for Non-Volatile Memory Applications", ResearchGate, Conference Paper, Oct. 2015, ©2015 IEEE, 5 pages, <https://www.researchgate.net/publication/291165978>.

Zhang et al., "A High Speed TRNG Based on SRAM for Resource Constrained Devices", UVaECEWiki, Dec 1, 2009, 22 pages, <https://venividiwiki.ee.virginia.edu/mediawiki/images/4/44/TRNG.ppt>.

\* cited by examiner

ON-CHIP HARDWARE RANDOM NUMBER GENERATOR

BACKGROUND OF THE INVENTION

The present invention relates generally to the field of circuit design, and more particularly to hardware random number generators.

Hardware random number generators (HRNGs) are devices that generate random numbers based on physical properties or processes of the device or components of the device. Some prior solutions to random number generation are provided in software, referred to as pseudorandom number generators (PRNGs). However, PRNGs are deterministic and whose operation can be predicted. HRNGs provide better randomness and are less predictable than PRNGs. Typical HRNGs use the entropy or variations of physical properties, such as thermal fluctuations or flicker noise, of the device components to randomly generate a value. Prior solutions typically use analog circuits to convert the measurements of the components to digital values to be used in a computing system. As such, prior HRNG solutions are built as separate components to a computing system, due to challenges integrating analog circuits with low power logic circuits that are used in many computing devices.

SUMMARY

Embodiments of the present invention provide a for an electric device for a hardware random number generator. The hardware random number generator comprises: one or more bitcells which comprise a first pair of a first transistor and a first tunable resistor and a second pair of a second transistor and a second tunable resistor, with the first pair is cross-coupled with the second pair.

DETAILED DESCRIPTION

Embodiments of the present invention recognize that by providing a hardware random number generator (HRNG) that can be integrated on-chip with the same chip package as a processor, improvements to security can be provided. Typical prior solutions to HRNGs require the use and reading of analog circuitry, where the analog circuitry is utilized to generate a random signal that is converted to a digital number. Such solutions are placed "off-chip", such as outside the processor chip package or as another component of a motherboard for a computing system. Since the HRNG is off-chip and commutatively coupled to the processor in prior solutions, the communication between the processors and prior HRNGs creates a security vulnerability for bus-snooping or other side-channel attacks.

Embodiments of the present invention recognize that by providing a HRNG that can be integrated and composed of components found in logic circuits, such snooping can be eliminated. Furthermore, by being composed of components used in logic circuits, embodiments of the present invention can be incorporated into a processer as instructions or functions of the processor, thereby increasing the availability of HRNGs in computing systems, where prior solutions required specialized, and separate, circuitry to be provided in order to offer similar functions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 1:
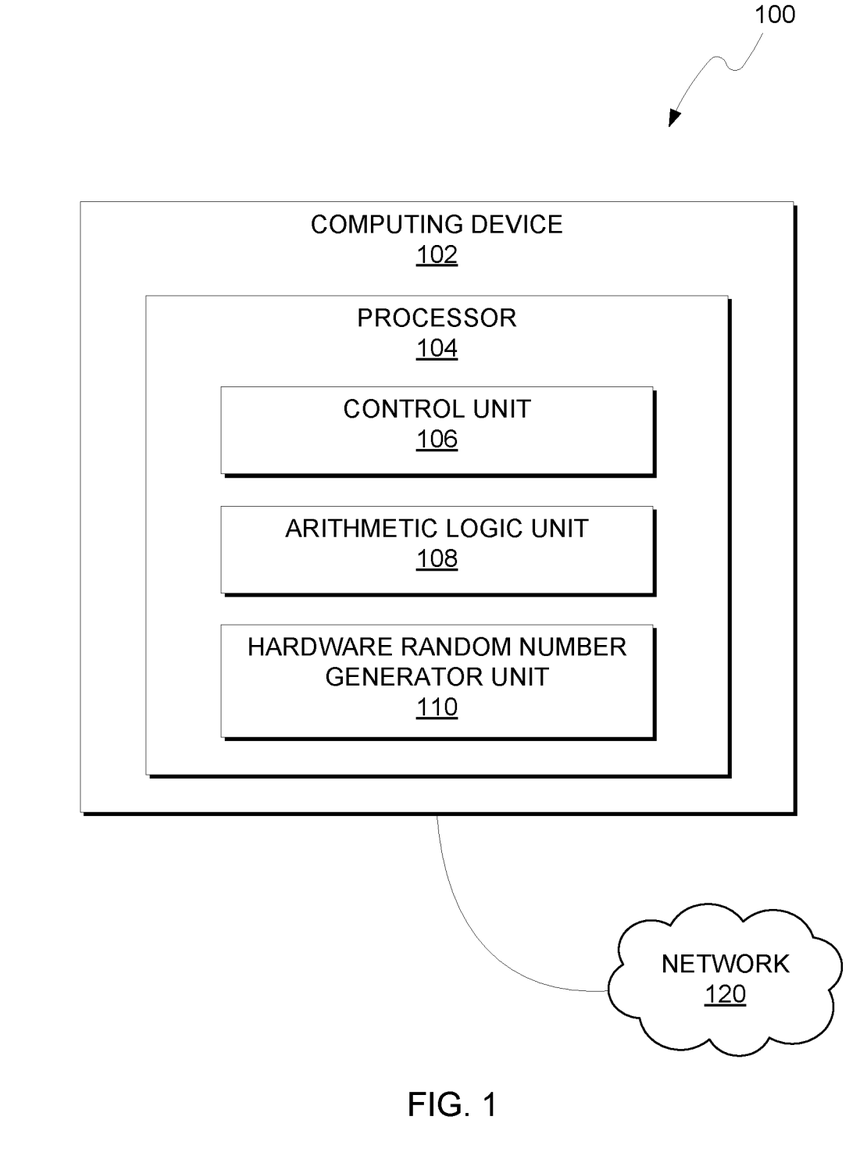
FIG. 1 is a functional block diagram illustrating a computing environment with a computing device, in accordance with an embodiment of the present invention.

The present invention will now be described in detail with reference to the Figures. FIG. 1 is a functional block diagram illustrating a computing environment, generally designated 100, in accordance with one embodiment of the present invention. Computing environment 100 includes a computing device 102 connected over network 120. Computing device 102 includes processor 104. Processor 104 contains circuit logic for control unit 106, arithmetic logic unit (ALU) 108 and hardware random number generator (HRNG) unit 110.

In various embodiments of the present invention, computing device 102 is a computing device that can, for example, be a standalone device, a server, a laptop computer, a tablet computer, a netbook computer, a personal computer (PC), or a desktop computer. In another embodiment, computing device 102 represents a computing system utilizing clustered computers and components to act as a single pool of seamless resources. In general, computing device 102 can be any computing device or a combination of devices with access to processor 104 and is capable of executing control unit 106, ALU 108 and HRNG unit 110. Computing device 102 may include internal and external hardware components, as depicted and described in further detail with respect to FIG. 4.

In this exemplary embodiment, control unit 106, ALU 108 and HRNG unit 110 are part of processor 104. However, in other embodiments, control unit 106, ALU 108 and/or HRNG unit 110 may be stored externally and accessed through a communication network, such as network 120. Network 120 can be, for example, a local area network (LAN), a wide area network (WAN) such as the Internet, or a combination of the two, and may include wired, wireless, fiber optic or any other connection known in the art. In general, network 120 can be any combination of connections and protocols that will support communications between computing device 102 and other devices (not shown), in accordance with embodiments of the present invention.

In various embodiments, computing device 102 includes processor 104. Processor 104 performs arithmetic, logic, control and various other operations for computing device 102. Control unit 106 is a controller of processor 104 that contains logic and circuitry to direct the operation of the various components and other units of processor 104 in order to affect the execution of various instructions and operation of processor 104. ALU 108 is an arithmetic logic unit that performs arithmetic and other logic operations, such as adding two numbers together.

In some embodiments, HRNG unit 110 is a component of processor 104. In such embodiments and scenarios, HRNG unit 110 is part of the chip package that houses processor 104. When manufactured, the various integrated circuits, logic and other components of devices such as processor 104 are housed in a packaging or chip package that protects the device but also provides contacts or other types of connections such that the device can communicate and provide functionality to a computing system, such as computing device 102.

In some embodiments, HRNG unit 110 is included in or part of ALU 108, or another logic component of processor 104 (not shown), as part of processor 104. In other embodiments, HRNG unit 110 is a separate component of computing device 102 and external to processor 104 such as a peripheral or other connected device to computing device 102. As discussed herein, HRNG unit 110 includes circuit elements that are common in logic and control circuits found in processors, such as processor 104. As such, in some embodiments and scenarios, HRNG unit 110 is integrated into a processor either as part of the processor's package, or as part of another component of the processor (e.g., ALU 108). In other embodiments, HRNG unit 110 is external to processor 104 and is a separate device or component of computing device 102.

Figure 2:
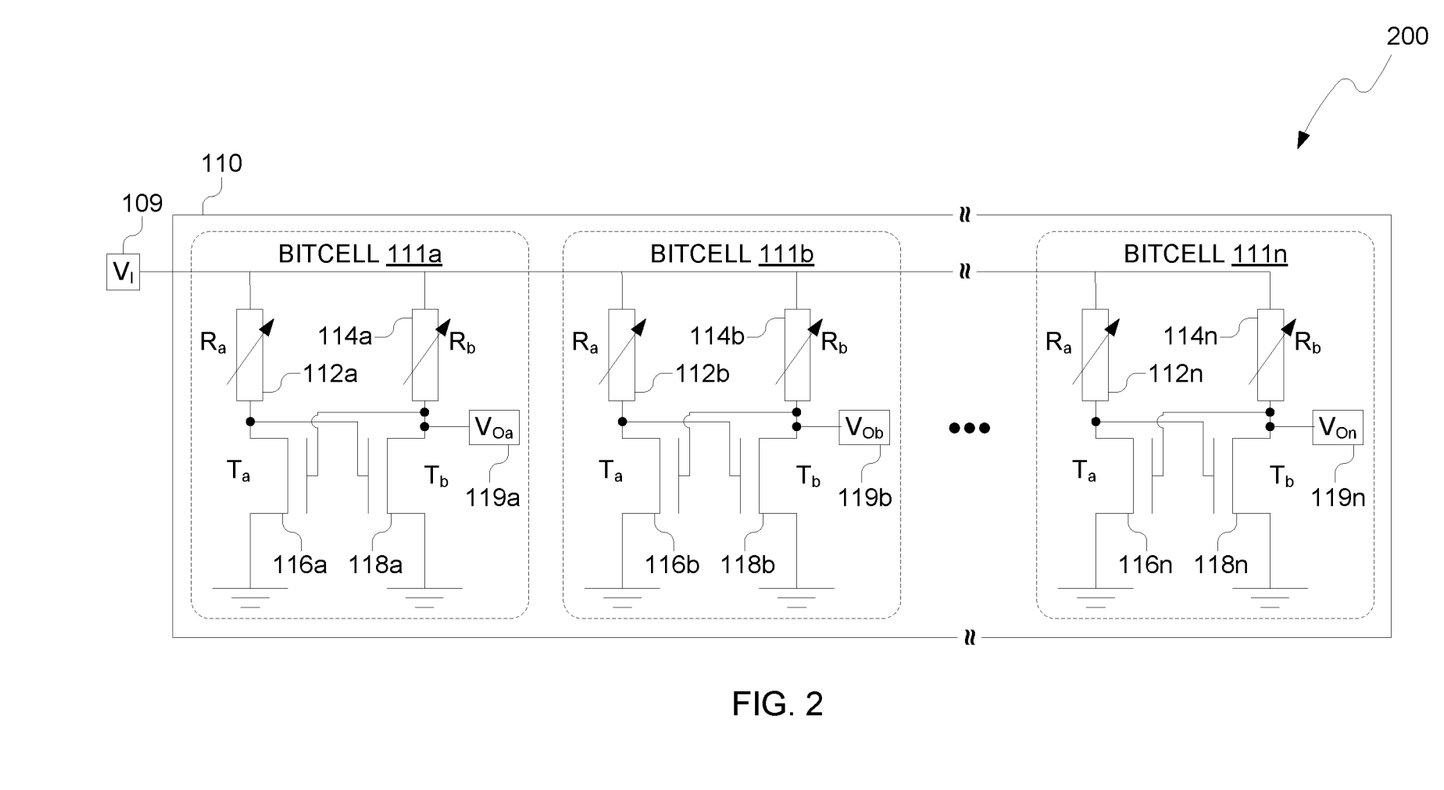
FIG. 2 illustrates a circuit diagram for a hardware random number generator, in accordance with an embodiment of the present invention.

FIG. 2 illustrates a circuit diagram, generally designated as 200, for HRNG unit 110. HRNG unit 110 includes one or more bitcells 111a-n. HRNG unit 110 generates an array of random bit values of a given length "n", where "n" is the number or amount of bitcells provided by HRNG unit 110. For example, if HRNG unit 110 is designed to generate a 32-bit long random number, then HRNG unit 110 includes at least 32 bitcells. Each bitcell of bitcells 111a-n is supplied an input voltage $V_I$ 109. Based on the current operation of HRNG unit 110, control unit 106 applies different levels of voltage to $V_I$ 109, as discussed herein. Each bitcell of bitcells 111a-n include two pairs of a tunable resistor and transistor connected in series. Looking at bitcell 111a, the first pair comprises tunable resistor 112a and transistor 116a and the second pair comprises resistor 114a and transistor 118a.

In various embodiments, tunable resistors 112a-n and 114-a-n are one of the following types of tunable resistors: phase change resistors (PCRs), magnetic tunnel junction (MTJ) resistors, or transition metal oxide (TMO) resistors. One of ordinary skill in the art will appreciate the properties of the above types of resistors. Each of the PCRs, MTJ and TMO resistors each have changing resistance properties based on the voltage applied to the resistors. Each of the PCRs, MTJ and TMO resistors have two states: a "high resistance" state and a "low resistance" state based on the applied voltage being above a certain threshold. Additionally, the exact resistive value for each state, for a given resistor type and design, changes for each cycle of change between low and high resistive states.

Additionally, for each transition between a "high resistance" state and a "low resistance" state, the PCRs, MTJ and TMO resistance values for the respective state are different than previous resistance values for the same state from a prior reading. Prior art solutions that employ PCRs, MTJ and TMO resistors are typically directed towards using PCRs, MTJ and TMO resistors in memory storage devices and are typically designed to combat or lessen the impact the variance of resistance values changes between states. Embodiments of the present invention recognize that the natural variance in resistance caused by each cycle from "low resistance" to "high resistance", back to "low resistance" results in different and random resistance values when comparing values for both "low resistance" states. Each bitcell of bitcells 111a-n, includes two tunable resistors that each include a PCRs, MTJ and TMO resistor that provide this function. One of ordinary skill in the art will appreciate that any resistor or circuit component that shares this property may be used without deviating from the invention.

In some embodiments, resistors 112a-n and 114a-n are phase change resistors (PCRs). PCRs comprise a bottom electrode, phase changing material, and a top electrode, each of which are layered in a stack. An example phase changing material is chalcogenide. When a voltage above a certain threshold is applied to the PCR, the phase changing material forms into an amorphous state from crystalline state. During this amorphous state, the PCR has a "high" resistance value. When a voltage below a certain threshold is applied to the PCR, the phase changing material forms back into a crystalline state which has a "low" resistance value. Also, for each transition into a "high resistance" state or a "low resistance" state results in a different resistance value within a range of "high" resistance values or "low" resistance values. Examples of phase change materials include Ge—Sb—Te (germanium-antimony-tellurium or "GST") alloy, Si—Sb—Te alloys, Ga—Sb—Te alloys, In—Se (indium tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the phase change material can further include nitrogen, carbon, and/or oxygen.

In some embodiments, resistors 112a-n and 114a-n are magnetic tunnel junction (MTJ) resistors. MTJ resistors comprise two layers of ferromagnets, a free layer and a fixed layer (or sometimes referred as "pinned layer" or "reference layer"). Both the free layer and the fixed layer include magnetic materials. The free and reference layers are separated by a tunnel barrier layer. The free layer and the reference layer are magnetically de-coupled by the tunnel barrier. The free layer has a variable magnetization direction, and the reference layer has an invariable magnetization direction. A wide variety of layers and elements (e.g., an MTJ cap, multiple free/reference layers, etc.) can be included in an MTJ stack. The free layer may comprise CoFeB or any other suitable materials. The fixed layer may comprise NiFe, Co/NiFe/Co, or any other suitable materials. Each layer may comprise a single or multiple laminated layer. The tunnel barrier layer may comprise of aluminum oxide (AlO) aluminum titanium oxide (AlTiO), or magnesium oxide (MgO). The MTJ stack may further comprise other layers such as antiferromagnetic (AFM) layer. The AFM layer may comprise Ir—Mn, Pt—Mn, Pt—Pd—Mn, Ni—Mn, or any other suitable materials.

MTJ resistors comprise two ferromagnets separated by a thin insulator. The resistance of an MTJ resistor is based on the spin polarizations of the free layer and the fixed layer. The direction of the spin polarizations of the ferromagnetic films can be altered by a magnetic field or electrical current. If the spin polarizations are in a parallel orientation, then the MTJ enters a "low resistance" state. If the spin polarizations of the ferromagnets are in a non-parallel orientation, then the MTJ enters a "high resistance" state. In some scenarios, MTJ resistors transition between states based on the applied current exceeding a threshold value of the MTJ. When the current exceeds this value the MTJ is toggled or switched from between "low" resistance to "high" resistance and from "high" resistance to "low" resistance. Similarly, when a high voltage is applied, thereby generating a greater current, the MTJ is also toggled between states.

In some embodiments, resistors 112a-n and 114a-n are transition metal oxide (TMO) resistors. TMO resistors include a semiconducting or transition metal oxide layer between to metal electrodes. The TMO may include nickel oxide, tantalum oxide, titanium oxide, hafnium oxide, tungsten oxide, zirconium oxide, aluminum oxide, strontium titanate, and combinations thereof. Based on the amplitude and/or polarity of applied voltage or current, a TMO resistor switches between a "high resistance" state and a "low resistance" state. When the applied voltage is above a threshold value, the oxide layer of the TMO resistor enters an amorphous state that exhibits a "high resistance" state. The operation principle of TMO is based on forming and dissolving of conducting filament in the TMO layer. The motions of ions or oxygen vacancies as a result of applied voltage or current is responsible for the forming and dissolving the conducting filaments. For example, when a conducting filament is formed, the TMO exhibits a "low resistance" state. When a conducting filament is dissolved, the TMO exhibits a "high resistance" state.

In various embodiments, resistors 112a-n and 114a-n include one of the following types of resistors: PCR, MTJ or TMO resistors. Each type of resistor possesses a property that when applied a voltage over a predetermined value, each resistor transitions between or to a "high" resistance state. Furthermore, while each type resistor is designed to have ranges for both high and low resistance states, each transition or cycle back to a previous state will result in slightly different values within the designed ranges. Prior solutions in memory and storage that utilize PCR, MTJ or TMO resistors typically account for the variances with various tolerances of other components to arrive at a desired operation. Embodiments of the present invention utilize the variance in state changes in a pair of PCRs, MTJ or TMO resistors to generate a hardware based random bit value for each bitcell of bitcells 111a-n. HRNG unit 110 includes an array of bitcells 111a-n to generate a random number of a desired length (e.g., the output from an array of sixteen bitcells is utilized to generate a 16-bit random number.

Referring back to bitcell 111a of FIG. 2, each resistor-transistor pair (i.e., the first pair comprising resistor 112a and transistor 116a, the second pair comprising resistor 114a and transistor 118a) connects a PCRs, MTJ or TMO resistor in series to a transistor. FIG. 2 illustrates a n-channel metal-oxide semiconductor field effect transistor (MOSFET) for transistors 116a-n and 118a-n. One of ordinary skill in the art will appreciate that any type of transistor may be used without deviating from the invention, such as, but not limited to, bipolar junction transistors (BJTs), p-channel MOSFETs, Fin Field Effect Transistors (FINFETs), nanowire transistors, nanosheet transistors, or fully depleted silicon-on-insulator (FDSOI) transistors.

In various embodiments, each resistor-transistor pair of bitcells 111a-n are cross-coupled to the other pair for each bitcell. Looking at bitcell 111a, a cross-coupled pair of resistor-transistor pairs connects the gate of one transistor (e.g., transistor 116a) to the source or drain of the transistor of the opposite pair (i.e., transistor 118a), and the gate of the other transistor (i.e., transistor 118a) is connected to the source of the transistor of the opposite pair (e.g., transistor 116a). One of ordinary skill in the art will appreciate that transistors 116a-n and 118a-n are depicted as switches in bitcells 111a-n. As such the drain and sources of transistors 116a-n and 118a-n can be used interchangeably.

In various embodiments, each bitcell of bitcells 111a-n has a voltage out ($V_O$) 119a-n. FIG. 2 illustrates that $V_O$ is taken from a voltage reading across the drain and source of the second resistor-transistor pair (i.e., transistors 118a-n). In other scenarios, a voltage reading across the drain and source of the first resistor-transistor pair (i.e., transistors 116a-n) is used for $V_O$ of bitcells 111a-n. As will be discussed during reading operations, after a settling period has occurred after a read signal is applied, one transistor of both pairs will be cut-off while the other transistor operates in saturation, resulting in readings form one transistor providing a low voltage or logic reading while saturated and the cutoff transistor providing a high voltage or logic reading.

In various embodiments, HRNG unit 110 operates based on two input signals a READ signal and a RESET signal. In various embodiments, a RESET signal is a high-voltage signal. For example, control unit 106 applies VDD or the power supply voltage. As discussed above, when a high voltage is applied to either a PCR, MTJ or TMO resistor, then the resistors change states, either toggling the current state such as in MTJs or reaching a high resistance state as with PCRs and TMOs. Furthermore, based on the properties of the PCR, MTJ and TMO resistors, when the state change occurs the resulting resistance value of the resistors falls within a range of resistance values, with the resistance values for the same state changing upon each state change. Embodiments of the present invention recognize that the variance in resistance achieved during each state change provides a stochastic mechanism that can be used as a basis for a hardware random number generator such as HRNG unit 110. In various embodiments, a READ signal is a low-voltage signal. As discussed above, when a low voltage is applied to either a PCR, MTJ or TMO resistor, then the resistors either change states to a low resistance state such as in PCRs and TMOs or keeps the current state as in MTJs. In READ operation mode, a low voltage is applied to input voltage $V_I$ 109. After the circuit settles and based on the current resistance values of the resistors in the bitcell, output voltage $V_O$ 119 is either a low or high logic value.

Prior to a READ operation of HRNG unit 110, input voltage $V_I$ 109 is not applied to HRNG unit 110. In this state, both transistors of each bitcell are cutoff and not conductive, being treated as having infinite or extremely large resistance values. Due to the cross-coupled design of bitcells 111a-n, once a voltage is applied to HRNG unit 110 during the READ operation, then the gate-to-source voltage becomes greater than the threshold voltage of the transistors and both transistors begin to be conductive across the drain and source, operating in the linear region of the transistors. During this region of operation, both transistors of the bitcell (e.g., 116a and 118a in bitcell 111a) become more conductive with the resistance across the drain and source decreasing. One of ordinary skill in the art will appreciate that the resistor and transistor in a given pair for a bitcell connected in series and can be treated as a voltage divider (e.g., resistor 112a and transistor 116a), where input voltage 109 is divided across the resistor and current operating drain-source resistance of the transistor.

As both transistors decrease in resistance and become more conductive, less voltage is divided across the transistor in the pair's voltage divider. Additionally, the cross coupled design of the bitcells of HRNG unit 110 apply the drain-source voltage as the gate-source voltage of the opposite pair. Once the drain-source voltage for one transistor reaches a value below the gate threshold voltage of the transistors, then the transistor in the other pair reverts back to a cut-off operation. Once this occurs, the conductive transistor reaches saturation and remains conductive until the READ signal is removed or another voltage is applied to input voltage 109.

In various embodiments, the resistance value of resistors during a READ operation determines which transistor reaches saturation and remains conductive during the READ operation. PCR, MTJ and TMO resistors can transition states and alter resistance values. During each transition, the resistor's resistance value stochastically or randomly changes to a value within a set range. One of ordinary skill in the art will appreciate that PCR, MTJ and TMO resistors can be designed to possess certain parameters such as, but not limited to, "high" and "low" resistance value ranges based on various design parameters, such as voltage values of READ and RESET signals.

In various embodiments, the pair with a lower resistance value for resistors 112a-n (e.g., first pair) or 114a-n (e.g., second pair) will result in the corresponding transistor to reach cut-off and become non-conductive, resulting in the output voltage across the non-conductive transistor to be the same as input voltage 109, which represents a high or "1" logic output. Conversely, the conductive and saturated transistor will produce a low output voltage of the saturated transistor, typically 0.2 V for MOSFETs, which represents a low or "0" logic output.

Figure 3:
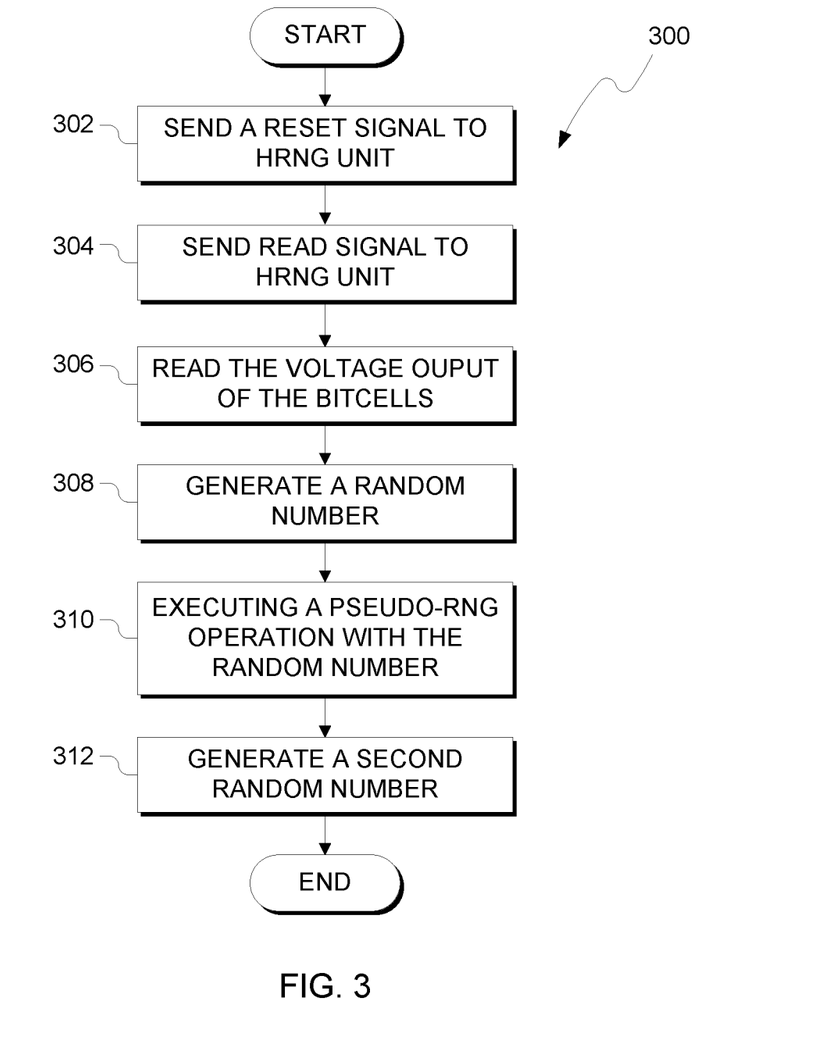
FIG. 3 illustrates operational processes of a processor control unit, on a computing device within the environment of FIG. 1, in accordance with an embodiment of the present invention.

FIG. 3 is a flowchart illustrating operational processes, generally designated 300, of control unit 106, executing on computing device 102, in accordance with an embodiment.

In process 302, control unit 106 sends a RESET signal to HRNG unit 110. A RESET signal for HRNG unit 110 is a higher value voltage when compared to the READ signal. In various embodiments, a high voltage signal applied to tunable resistors 112a-n and 114a-n causes a state change for the tunable resistors. For PCR, MTJ and TMO resistors, higher voltage values cause the resistors to enter a new state. During each state change, the resistance of PCR, MTJ and TMO resistors stochastically change to values within a given range for the current state. The unpredictability of the resistance values of tunable resistors 112a-n and 114a-n effect the output of each bitcell as discussed herein. In some embodiments, control unit 106 sends a RESET signal for each generation of a random number. In some embodiments, control unit 106 sends a RESET signal after or before each operation of HRNG unit 110.

In process 304, control unit 106 sends a READ signal to HRNG unit 110. A READ signal for HRNG unit 110 is a lower value voltage when compared to the RESET signal. In some embodiments, a low voltage signal applied to tunable resistors 112a-n and 114a-n causes a state change for the tunable resistors (e.g., PCR and TMO resistors). In some embodiments, a low voltage signal applied to tunable resistors 112a-n and 114a-n to generate a reading from HRNG unit 110 (e.g., where for MTJ the state only changes on high values). In such embodiments, control unit 106 may send two RESET signals to HRNG unit 110 to toggle from a low to high back to low resistance state.

In process 306, control unit 106 reads the voltage output for each bitcell. As discussed herein, based on the difference in resistance values, each bitcell outputs either a low or high voltage value. Based on the voltage value, control unit 106 determines a bit value to generate a random number equal in bitwise length to the number of bitcells in HRNG unit 110. For example, for low voltage values control unit 106 generates a "0" bit value for a binary number and conversely a "1" for high voltage values (process 308).

In some embodiments, control unit 106 stores the generated random binary number in a register of processor 104 for access by ALU 108 or other component of processor 104. In other embodiments, control unit 106 sends one or more commands or signals to a memory management unit (not shown) of processor 104 to store the random number in system or secondary memory.

In some embodiments, control unit 106 performs processes 310 and 312, utilizing the random number generated by HRNG unit 110 as a seed or input to a software based random number generator, or pseudo-random number generator (PRNG) to generate a second random number. Some applications and scenarios may require large random numbers with numerous, such a 256-bit encryption key. In some embodiments, control unit 106 causes ALU 108 or other computational unit such as a graphics processing unit (GPU, not shown) of computing device 102 to perform a PRNG operation or function to generate a second random number. In the example where a random 256-bit encryption key is desired, hardware design limitation may restrict HRNG unit 110 to be limited in the number of bitcells 111a-n. In this example, only a 32-bit wide HRNG unit 110 is provided in processor 104. In this case, ALU 108 performs one or more instructions to carry out a hash function, such as Secure Hash Algorithm 256 (SHA-256), in order to generate a 256-bit random number from the 32-bit random number generated by HRNG unit 110. Such embodiments and scenarios increase the versatility of HRNG unit 110 to still be used in applications that require random numbers outside the ranges provided by HRNG unit 110.

In some embodiments, HRNG unit 110 or control unit 106 generate a random number of a given bit-length from a single bitcell by cycling the RESET and READ operations for each bit needed in the random number. Due to the stochastic nature of resistance change of the tunable resistors, each cycle of operation will produce a random bit. By combining multiple random bits from multiple cycles of a single bit, we can get multiple-bit random number using a single bitcell.

In some embodiments, HRNG unit 110 or control unit 106 utilizes the output from multiple bitcells to generate a single bit value for the random number. In such scenarios and embodiments, HRNG unit 110 or control unit 106 combine or evaluate outputs from two bitcells to determine the final bit value. For example, HRNG unit 110 includes logic to performs a logic XOR (Exclusive or) on two or more bitcells.

Figure 4:
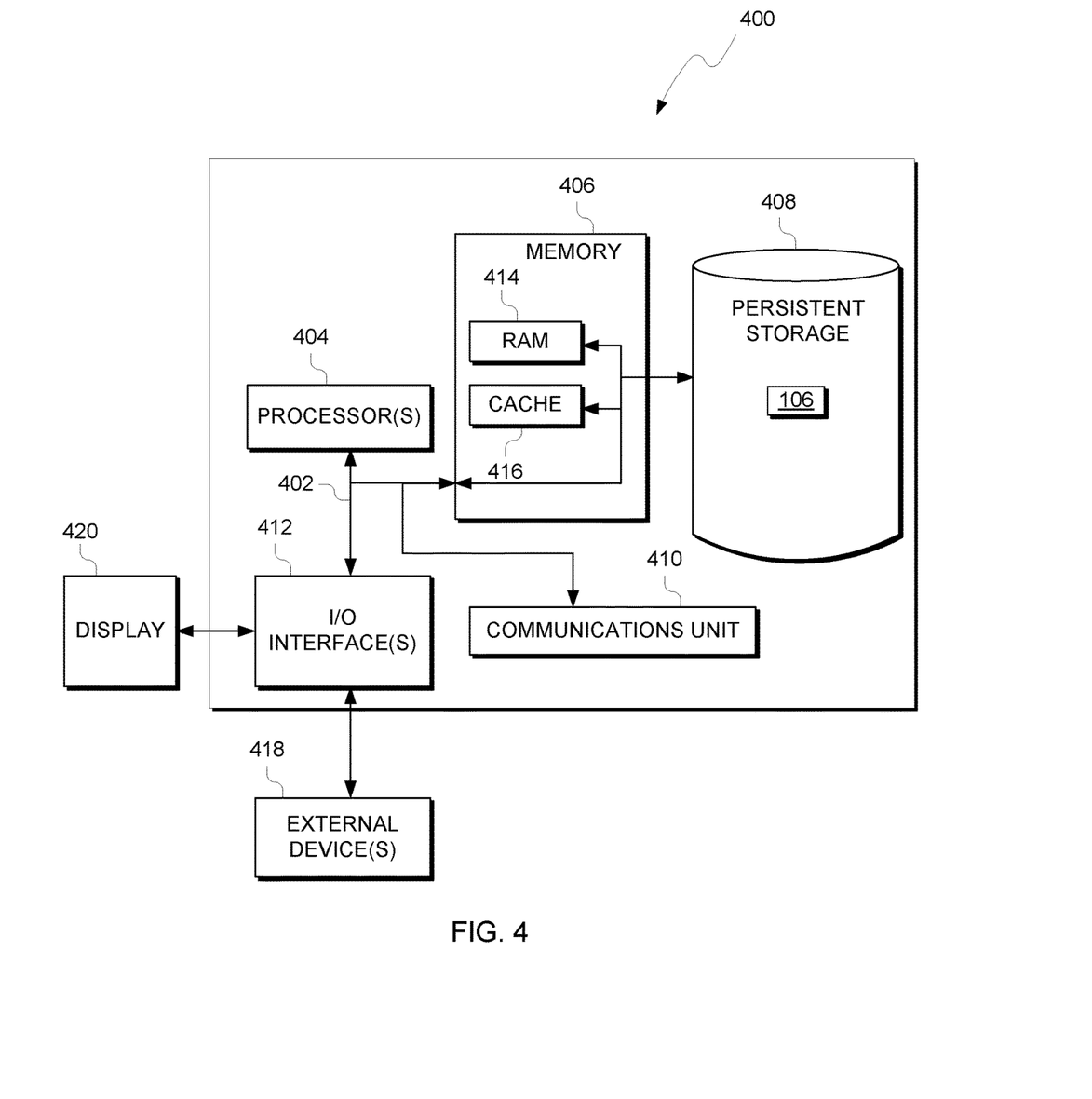
FIG. 4 depicts a block diagram of components of the computing device executing the method of FIG. 3, in accordance with an embodiment of the present invention.

FIG. 4 depicts a block diagram, 400, of components of computing device 102, in accordance with an illustrative embodiment of the present invention. It should be appreciated that FIG. 4 provides only an illustration of one implementation and does not imply any limitations with regard to the environments in which different embodiments may be implemented. Many modifications to the depicted environment may be made.

Computing device 102 includes communications fabric 402, which provides communications between computer processor(s) 404, memory 406, persistent storage 408, communications unit 410, and input/output (I/O) interface(s) 412. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer-readable storage media. In this embodiment, memory 406 includes random access memory (RAM) 414 and cache memory 416. In general, memory 406 can include any suitable volatile or non-volatile computer-readable storage media.

In some embodiments, instructions or operations associated with control unit 106, ALU 108 or HRNG unit 110 may be stored, respectively, in persistent storage 408 for execution and/or access by one or more of the respective computer processors 404 via one or more memories of memory 406. In this embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer-readable storage media that is capable of storing program instructions or digital information. In other embodiments, processor 104, control unit 106, ALU 108 or HRNG unit 110 may be respectively implemented as modules of computing device 102 or processor(s) 404. For example, a module or similar unit of functionality may be implemented as a hardware circuit comprising custom VLSI circuits or gate arrays, off-the-shelf semiconductors such as logic chips, transistors, or other discrete components. A module may also be implemented with programmable hardware devices such as field programmable gate arrays, programmable array logic, programmable logic devices or the like. A module or a set of modules may also be implemented (in whole or in part) as a processor configured with software to perform the specified functionality. An identified module may, for instance, comprise one or more physical or logical blocks of computer instructions which may, for instance, be organized as an object, procedure, or function. Nevertheless, the executables of an identified module need not be physically located together but may comprise disparate instructions stored in different locations which, when joined logically together, comprise the module and achieve the stated purpose for the module. A module may also be embodied as a server with a service executing thereon.

The media used by persistent storage 408 may also be removable. For example, a removable hard drive may be used for persistent storage 408. Other examples include optical and magnetic disks, thumb drives, and smart cards that are inserted into a drive for transfer onto another computer-readable storage medium that is also part of persistent storage 408.

Communications unit 410, in these examples, provides for communications with other data processing systems or devices, including resources of network 120. In these examples, communications unit 410 includes one or more network interface cards. Communications unit 410 may provide communications through the use of either or both physical and wireless communications links. Instructions or operations of control unit 106, ALU 108 or HRNG unit 110 116 may be, respectively, downloaded to persistent storage 408 through communications unit 410.

I/O interface(s) 412 allows for input and output of data with other devices that may be connected to computing device 110. For example, I/O interface 412 may provide a connection to external devices 418 such as a keyboard, keypad, a touch screen, and/or some other suitable input device. External devices 418 can also include portable computer-readable storage media such as, for example, thumb drives, portable optical or magnetic disks, and memory cards. Software and data used to practice embodiments of the present invention, e.g., functions, instructions and operations of processor 104, control unit 106, ALU 108 or HRNG unit 110 can be respectively stored on such portable computer-readable storage media and can be loaded onto persistent storage 408 via I/O interface(s) 412. I/O interface(s) 412 also connect to a display 420.

Display 420 provides a mechanism to display data to a user and may be, for example, a computer monitor, or a television screen.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

What is claimed is:

1. An electronic device comprising:
    a hardware random number generator, the hardware random number generator comprising:
        one or more bitcells, the one or more bitcells each comprising:
            a first pair of a first transistor and a first tunable resistor; and
            a second pair of a second transistor and a second tunable resistor;
    wherein:
        the first pair is cross-coupled with the second pair; and
        at least one bit-value of a random number generated by the hardware random number generator is based on an output voltage of at least one bitcell of the one or more bitcells.

2. The electronic device of claim 1, wherein the hardware random number generator is included in a processor package.

3. The electronic device of claim 1, wherein the first tunable resistor or the second tunable resistor is one of the following: a phase change resistor, a magnetic tunnel junction resistor, or a transition metal oxide resistor.

4. The electronic device of claim 3, wherein a read signal is applied to the first tunable resistor and the second tunable resistor during a reading of the one or more bitcells.

5. The electronic device of claim 3, wherein a reset signal is applied to the first tunable resistor and the second tunable resistor after a reading of the one or more bitcells.

6. The electronic device of claim 5, wherein both a resistance value of the first tunable resistor and a resistance value of the second tunable resistor change upon a subsequent reading based on toggling the first tunable resistor and the second tunable resistor between a high resistance state and a low resistance state.

7. The electronic device of claim 1, wherein one or more respective logic values associated with the one or more bitcells are based on a difference in resistance values between the first tunable resistor and the second tunable resistor.

8. A method comprising:
    sending, by a processor, a reset signal to at least one bitcell of a hardware random number generator unit, wherein (i) the reset signal is above a first predetermined threshold voltage and (ii) the reset signal causes the hardware random number generator to change a resistance state of a tunable resistor of the at least one bitcell of the hardware random number generator unit;
    sending, by the processor, a read signal to the at least one bitcell of a hardware random number generator unit, wherein (i) the read signal is below a second predetermined threshold voltage and (ii) the read signal causes the at least one bitcell to produce an output voltage; and
    generating, by the processor, at least one bit-value of a random number based on the output voltage of the at least one bitcell.

9. The method of claim 8, wherein the hardware random number generator is included in the same packaging as the processor.

10. The method of claim 8, wherein the tunable resistor is one of the following: a phase change resistor, a magnetic tunnel junction resistor, or a transition metal oxide resistor.

11. The method of claim 8, the method further comprising:
    executing, by the processor, one or more instructions to generate a pseudo-random number, wherein the random number is a seed input for a hash function.

12. A computer program product comprising:
a computer readable storage medium and program instructions stored on the computer readable storage medium, the program instructions comprising:
program instructions to send, by a processor, a reset signal to at least one bitcell of a hardware random number generator unit, wherein (i) the reset signal is above a first predetermined threshold voltage and (ii) the reset signal causes the hardware random number generator to change a resistance state of a tunable resistor of the at least one bitcell of the hardware random number generator unit;
program instructions to send, by the processor, a read signal to the at least one bitcell of a hardware random number generator unit, wherein (i) the read signal is below a second predetermined threshold voltage and (ii) the read signal causes the at least one bitcell to produce an output voltage; and
program instructions to generate, by the processor, at least one bit-value of a random number based on the output voltage of the at least one bitcell.

13. The computer program product of claim 12, wherein the hardware random number generator is included in the same packaging as the processor.

14. The computer program product of claim 12, wherein the tunable resistor is one of the following: a phase change resistor, a magnetic tunnel junction resistor, or a transition metal oxide resistor.

15. The computer program product of claim 12, the program instructions further comprising:
program instructions to execute, by the processor, one or more instructions to generate a pseudo-random number, wherein the random number is a seed input for a hash function.

* * * * *